(12) United States Patent
Peng et al.

(10) Patent No.: US 10,367,118 B2
(45) Date of Patent: Jul. 30, 2019

(54) LIGHT-EMITTING DIODE

(71) Applicant: EPISTAR CORPORATION, Hsinchu (TW)

(72) Inventors: Yu-Ren Peng, Hsinchu (TW); Tzu-Chieh Hsu, Hsinchu (TW); Shih-I Chen, Hsinchu (TW); Rong-Ren Lee, Hsinchu (TW); Hsin-Chan Chung, Hsinchu (TW); Wen-Luh Liao, Hsinchu (TW); Yi-Chieh Lin, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/266,249

(22) Filed: Sep. 15, 2016

(65) Prior Publication Data

US 2017/0005227 A1 Jan. 5, 2017

Related U.S. Application Data

(63) Continuation of application No. 14/625,156, filed on Feb. 18, 2015, now Pat. No. 9,472,719.

(51) Int. Cl.
| | |
|---|---|
| *H01L 33/10* | (2010.01) |
| *H01L 33/12* | (2010.01) |
| *H01L 33/42* | (2010.01) |
| *H01L 33/38* | (2010.01) |
| *H01L 33/46* | (2010.01) |
| *H01L 33/30* | (2010.01) |

(52) U.S. Cl.
CPC ............ *H01L 33/105* (2013.01); *H01L 33/10* (2013.01); *H01L 33/12* (2013.01); *H01L 33/38* (2013.01); *H01L 33/42* (2013.01); *H01L 33/46* (2013.01); *H01L 33/30* (2013.01)

(58) Field of Classification Search
CPC ......... H01L 33/10; H01L 33/12; H01L 33/38; H01L 33/42; H01L 33/46; H01L 33/105
See application file for complete search history.

(56) References Cited

U.S. PATENT DOCUMENTS

| | | | | |
|---|---|---|---|---|
| 5,404,031 | A * | 4/1995 | Sasaki | H01L 33/0062 257/95 |
| 6,097,041 | A | 8/2000 | Lin | |
| 7,569,866 | B2 | 8/2009 | Konno | |
| 9,673,354 | B2 * | 6/2017 | Moon | H01L 33/38 |
| 9,705,034 | B2 * | 7/2017 | Matsumura | H01L 33/0066 |
| 2003/0038284 | A1 | 2/2003 | Kurahashi | |
| 2004/0075102 | A1 | 4/2004 | Chen | |
| 2004/0135166 | A1 | 7/2004 | Yamada | |
| 2004/0227151 | A1 * | 11/2004 | Konno | H01L 33/02 257/103 |
| 2007/0075321 | A1 | 4/2007 | Konno | |
| 2008/0173887 | A1 | 7/2008 | Baba | |

(Continued)

*Primary Examiner* — Allan R Wilson
(74) *Attorney, Agent, or Firm* — Muncy, Geissler, Olds & Lowe, P.C.

(57) ABSTRACT

A light-emitting diode, comprises an active layer for emitting a light ray; an upper semiconductor stack on the active layer, wherein the upper semiconductor stack comprises a window layer; a reflector; and a lower semiconductor stack between the active layer and the reflector; wherein the thickness of the window layer is small than or equal to 3 μm, and the thickness of the lower semiconductor stack is small than or equal to 1 μm.

20 Claims, 2 Drawing Sheets

(56) References Cited

U.S. PATENT DOCUMENTS

| | | |
|---|---|---|
| 2010/0301362 A1 | 12/2010 | Lizuka |
| 2011/0148284 A1* | 6/2011 | Nagao ............... H01L 21/02376 313/498 |
| 2011/0204324 A1* | 8/2011 | Kim ..................... G02B 6/0073 257/13 |
| 2011/0204401 A1* | 8/2011 | Kim ........................ H01L 33/10 257/98 |
| 2012/0273793 A1* | 11/2012 | Nishikawa .............. H01L 33/14 257/76 |
| 2013/0228818 A1 | 9/2013 | Suzuki |
| 2013/0285099 A1* | 10/2013 | Hodota .................. H01L 33/10 257/98 |
| 2014/0327028 A1* | 11/2014 | Matsumura ......... H01L 33/0066 257/98 |
| 2014/0377459 A1 | 12/2014 | Kawashima |
| 2015/0129920 A1 | 5/2015 | Park |
| 2015/0155433 A1* | 6/2015 | Lo .......................... H01L 33/10 257/94 |
| 2015/0349220 A1 | 12/2015 | Moon |
| 2017/0047478 A1* | 2/2017 | Lu ........................ H01L 33/005 |

* cited by examiner

LIGHT-EMITTING DIODE

REFERENCE TO RELATED APPLICATION

This application is a continuation application of U.S. patent application Ser. No. 14/625,156, filed Feb. 18, 2015.

TECHNICAL FIELD

The application relates to a light-emitting diode and, in particular, relates to a light-emitting diode having a reflective layer for improving the light extracting efficiency.

DESCRIPTION OF BACKGROUND ART

The radiation theory and structure of light-emitting diodes (LED) are different from that of conventional lighting sources, such as fluorescent lamps or incandescent lamps. LEDs have advantages as low power consumption, long life-time and fast responsive time. Moreover, LEDs are compact, shockproof, and environment-friendly, so LEDs are widely adopted in the market. For example, LEDs can be used in display apparatus, indoor or outdoor lighting, data storage devices, communication devices, medical devices, and so on.

An LED normally include a substrate, a light-emitting stack including an n-type semiconductor layer, an active layer, and a p-type semiconductor layer on the substrate for emitting light.

The total amount of light emitted from an LED device (i.e., the total integrated flux) is the integrated flux emitted from the topside of the device added to the integrated flux emitted from the sidewalls of the device. Side-emitted light is typically guided to the sidewalls of the device by a waveguide created by reflective surfaces formed of various layers having different refractive indices. Waveguided light typically undergoes several reflections along the light path to the sidewalls of the LED device, and therefore loss intensity by each reflection. It is advantageous to extract as much light as possible from the topside of the device by reducing internal losses and increase the total integrated flux. In GaN series LED, the refractive indices of sub-layers of the n-type semiconductor layer or the p-type semiconductor layer are about similar, the n-type semiconductor layer or the p-type semiconductor layer can be regarded as a single semiconductor layer for designing the distance between the active layer and the reflective layer in order to reduce the interference between the light from the active layer propagating towards the topside of the LED device and the light reflected by the reflective layer.

SUMMARY OF THE DISCLOSURE

A light-emitting diode, comprises an active layer for emitting a light ray; an upper semiconductor stack on the active layer, wherein the upper semiconductor stack comprises a window layer; a reflector; and a lower semiconductor stack between the active layer and the reflector; wherein the thickness of the window layer is small than or equal to 3 μm, and the thickness of the lower semiconductor stack is small than or equal to 1 μm.

DETAILED DESCRIPTION OF PREFERRED EMBODIMENTS

Figure 1A:
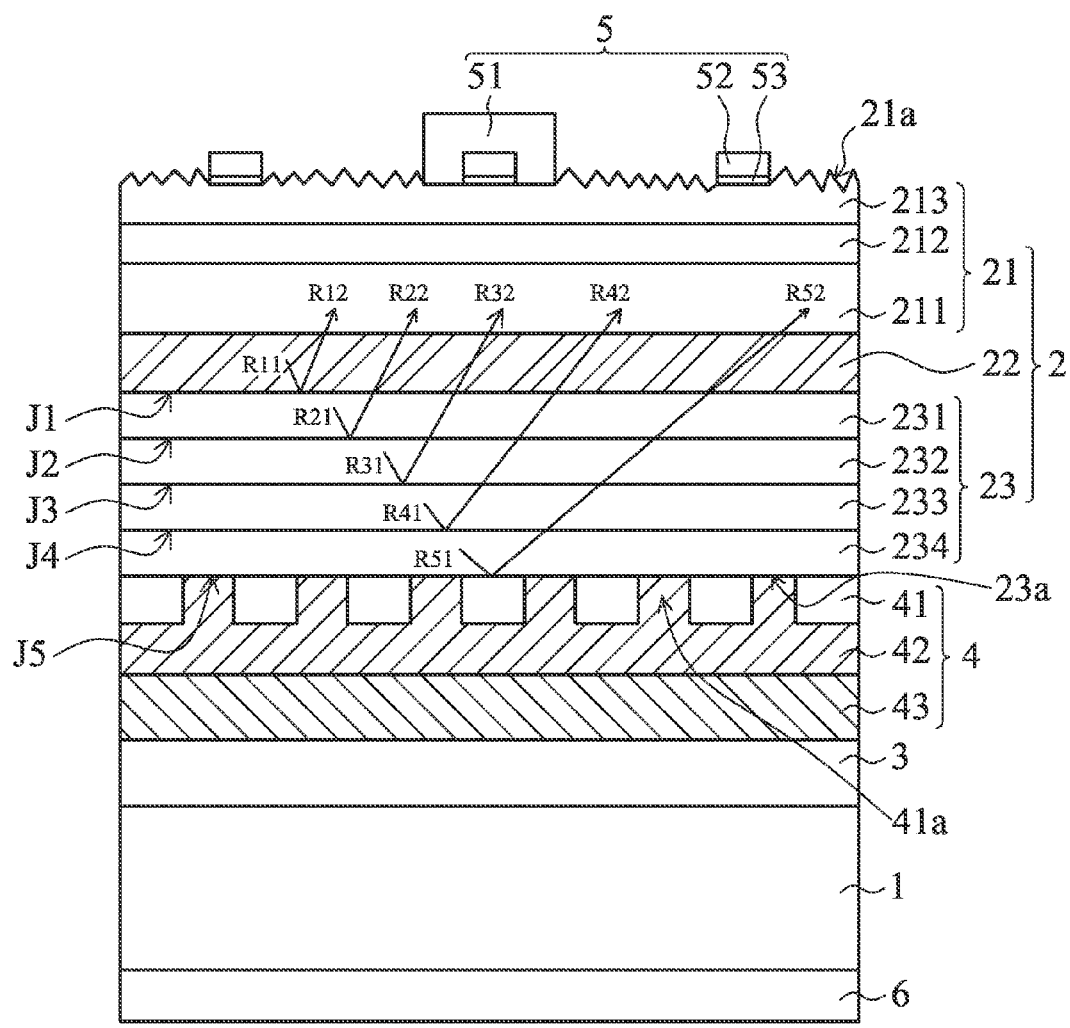
FIG. 1A shows a light-emitting diode in accordance with one embodiment of the present application.

FIG. 1A shows a light-emitting diode 100 comprising a substrate 1, a reflective structure 4 on the substrate 1, a bonding layer 3 between the substrate 1 and the reflective structure 4 for adhering the reflective structure 4 and the substrate 1, an epitaxial semiconductor stack 2 on the reflective structure 4, a front electrode 5 on the epitaxial semiconductor stack 2 and a rear electrode 6 on the back side of the substrate 1 opposite to the front side where the bonding layer 3 is positioned.

The epitaxial semiconductor stack 2 comprises an upper semiconductor stack 21, a lower semiconductor stack 23, and an active layer 22 between the upper semiconductor stack 21 and the lower semiconductor stack 23, wherein the upper semiconductor stack 21 has an upper surface 21a and the lower semiconductor stack 23 has a lower surface 23a. The upper semiconductor stack 21 and the lower semiconductor stack 23 have different electrical conductivity-types for providing electric holes and electrons respectively by doping carriers; the active layer 22 is capable of emitting light. The active layer 22 comprises a single heterostructure (SH), double heterostructure (DH), double-side double heterostructure (DDH) or multi-quantum well (MQW) structure. Specifically, the active layer 22 comprises well layers and barrier layers laminated alternately. When an electrical current flows through the epitaxial semiconductor stack 2, the active layer 22 is capable of emitting light. For example, the material of the active layer 22 comprises aluminum gallium indium phosphide (AlGaInP) series compound for emitting red, orange, yellow or amber light, or indium gallium nitride (InGaN) series compound for emitting blue, UV or green light.

The front electrode 5 is formed on the upper surface 21a and comprises a bonding portion 51 and a finger portion 52. The bonding portion 51 is used for wire bonding to an external device and conducting an electrical current into the epitaxial semiconductor stack 2. The finger portion 52 is used for spreading the electrical current uniformly around the light-emitting diode 100 and ohmically contacts the upper semiconductor stack 21 through a contact layer 53. The materials of the bonding portion 51 and the finger portion 52 comprise Au, Ge, Be, Ni, Pd, Zn, GeAu, GeAuNi, BeAu or the combination thereof, and the material of the contact layer 53 comprises GaAs heavily doped with an carrier concentration greater than $10^{18}$ cm$^{-3}$, wherein the contact layer 53 is only formed under the finger portion 52 for preventing from absorbing the light emitted from the active layer 22. The upper surface 21a exposed by the front electrode 5 can be roughened to increase the light extraction efficiency.

Figure 1B:
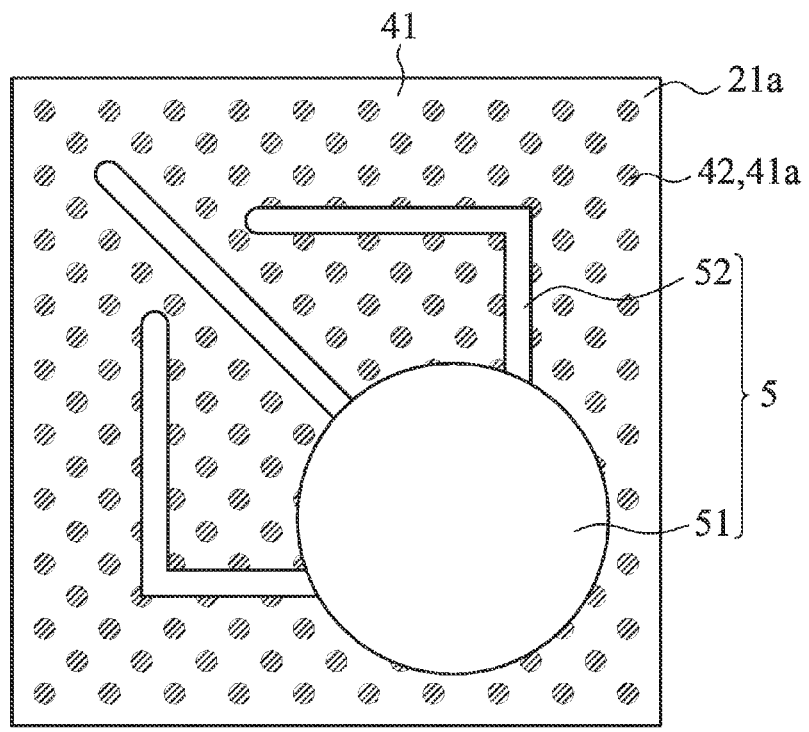
FIG. 1B shows a top view of the light-emitting diode in accordance with one embodiment of the present application.
Figure 1C:
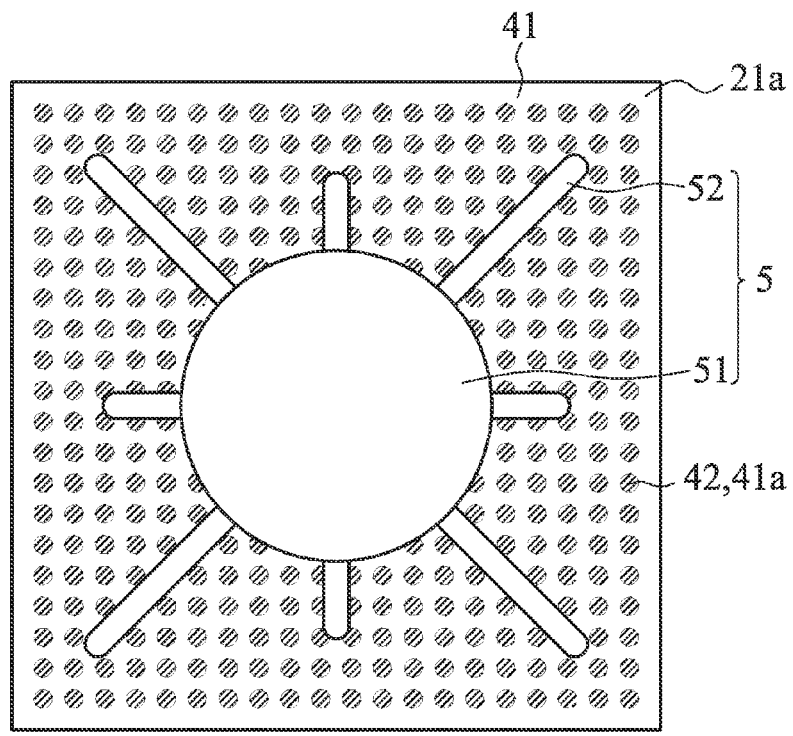
FIG. 1C shows a top view of the light-emitting diode in accordance with one embodiment of the present application.

The reflective structure 4 is formed on the lower surface 23a for reflecting the light from the active layer 22 toward the upper surface 21a or the side wall of the semiconductor stack 2. The reflective structure 4 comprises a patterned transparent insulating layer 41, which comprises Al$_2$O$_3$, SiNx, SiO$_2$, TiO$_2$ or MgF$_2$, a transparent conductive oxide layer 42, which comprises ITO, InO, SnO, CTO, ATO, AZO, ZTO or ZnO, and a reflective metal layer 43, which comprises Ag, Au or Al. The reflective metal layer 43 has a reflectivity larger than 80% for the light emitted by the active layer 22. The patterned transparent insulating layer 41 is electrically insulated for blocking the electrical current passing therethrough and has refractive index lower than 1.5. The patterned transparent insulating layer 41 is formed on the lower surface 23a and contacts the lower semiconductor stack 23, which has a refractive index larger than 2. The refractive index of the patterned transparent insulating layer 41 is at least 0.5 lower than that of the lower semiconductor stack 23 to form a total-internal-reflection (TIR) interface for reflecting the light emitted from active layer 22. The patterned transparent insulating layer 41 contacts the lower semiconductor stack 23 and has multiple openings 41a exposing a portion of the lower surface 23a. FIG. 1B shows the top view of the light-emitting diode 100 as described in FIG. 1A according to one embodiment of the present disclosure. The shape of the upper surface 21a is square and the multiple openings 41a are uniformly distributed in the patterned transparent insulating layer 41. A portion of the multiple openings 41a are under the bonding portion 51 and the finger portion 52. The bonding portion 51 is near one corner of the upper surface 21a, and the finger portion 52 extends from the bonding portion 51 to the corner opposite to the bonding portion 51. In another embodiment, as shown in FIG. 1C, the bonding portion 51 is at the center of the upper surface 21a, and the finger portion 52 extends from the bonding portion 51 toward the four corners and the edge of the upper surface 21a.

The transparent conductive oxide layer 42 is formed of electrically conductive material for conducting the electrical current and has a refractive index between 1.5 and 2.5 or preferred between 1.8 and 2.2. The transparent conductive oxide layer 42 covers the patterned transparent insulating layer 41 and fills into the multiple openings 41a for ohmically contacting the lower semiconductor stack 23 and conducting the electrical current therethrough. Since the patterned transparent insulating layer 41 is electrically insulated, the electrical current is blocked by the patterned transparent insulating layer 41 and uniformly spreaded through the multiple openings 41a to the epitaxial semiconductor stack 2. The difference between the refractive index of the transparent conductive oxide layer 42 and that of the lower semiconductor stack 23 is between 0.5 and 1.5 to form a total-internal-reflection (TIR) interface for reflecting the light emitted from active layer 22. The reflective metal layer 43 covers the transparent conductive oxide layer 42 for reflecting the light passing through the interface J5 or the interface between the transparent conductive oxide layer 42 and the patterned transparent insulating layer 41. The reflective metal layer 43 ohmically contacts the transparent conductive oxide layer 42 for conducting the electrical current between the epitaxial semiconductor stack 2 and the bonding layer 3. The patterned transparent insulating layer 41, the transparent conductive oxide layer 42 and the reflective metal layer 43 form an ODR (omini-directional reflector) to increase the light extraction efficiency of the light-emitting diode 100.

The material of the bonding layer 3 comprises Ti, W, Pt, Ni, Sn, Au or the alloy thereof for adhering the reflective layer 4 to the substrate 1 and conducting the electrical current therethrough. The material of the substrate 1 includes but is not limited to electrically conductive substrate, such as Si, GaAs, and CuW, which can mechanically support the light-emitting diode 100 and conduct the electrical current therethrough. The rear electrode 6 on the back side of the substrate 1 comprises Au, Ge, Be, Ni, Pd, Zn or the alloy thereof.

First Embodiment

In the present embodiment, the material for forming the epitaxial semiconductor stack 2 comprises aluminum gallium indium phosphide (AlGaInP) series compound. The lower semiconductor stack 23 comprises multiple semiconductor layers, wherein each of the multiple semiconductor layers has an element composition and a refractive index different from each other. Each of the multiple semiconductor layers has two sides contacting adjacent layers to form two interfaces respectively. The upper semiconductor stack 21 comprises a confining layer 211 contacting the active layer 22, a cladding layer 212 contacting the confining layer 211 and a window layer 213 contacting the cladding layer 212. The lower semiconductor stack 23 comprises a confining layer 231 contacting the active layer 22, a cladding layer 232 contacting the confining layer 231, a buffer layer 233 contacting the cladding layer 232 and a contact layer 234 contacting the buffer layer 233, the patterned transparent insulating layer 41 and the transparent conductive oxide layer 42, and thus an interface J1 is formed between the active layer 22 and the confining layer 231, an interface J2 is formed between the confining layer 231 and the cladding layer 232, an interface J3 is formed between the cladding layer 232 and the buffer layer 233, J4 is formed between the buffer layer 233 and the contact layer 234, and an interface J5 is formed between the contact layer 234 and the reflective structure 4. The active layer 22 is formed of multiple pairs of barrier layer and well layer laminated alternately, wherein the barrier layer has a bandgap greater than that of the well layer. The thickness of each of the barrier layer and the well layer is generally between 20 Å and 100 Å. When an electrical current is injected into the semiconductor stack 2, electrons and holes recombine in the active layer 22 to emit light. The confining layer 231 and the confining layer 211 both have bandgaps larger than that of the barrier layer of the active layer 22, so the confining layer 231 and the confining layer 211 are able to increase the probability of the recombination of electrons and holes in the active layer 22. The thicknesses of the confining layer 231 and the confining layer 211 are both between 200 Å and 3000 Å. The cladding layer 232 and the cladding layer 212 are used for providing electrons and holes. The thicknesses of the cladding layer 232 and the cladding layer 212 are both between 1000 Å and 5000 Å. The thickness of the window layer 213 is between 2 μm and 3 μm, and the upper surface 21a of the window layer 213 is optionally roughened, so the window layer 213 is able to increase the light extracting from the upper semiconductor stack 21. Because the contact layer 234 ohmically contacts the reflective structure 4. The lattice constant of the contact layer 234 is different from that of the cladding layer 232, so the buffer layer 233, which is interposed between the cladding layer 232 and the contact layer 234, has a lattice constant between that of the contact layer 234 and that of the cladding layer 232 for reducing the crystal defects of the contact layer 234.

When a light ray emitted from the active layer 22 is reflected by the reflective structure 4 and is extracted from the upper surface 21a, the light ray passes through the lower semiconductor stack 23 at least two times as indicated by the incident light ray R51 and reflective light ray R52 in FIG. 1A. It is preferred that the refractive indices of the active layer 22, the confining layer 231, the cladding layer 232, the buffer layer 233 and the contact layer 234 are different, when the incident light ray R11 passes through the interface J1 between the active layer 22 and the confining layer 231, the reflective light ray R12 is reflected by the interface J1.

Similarly, the reflective light rays R22, R32, R42 and R52 are reflected by the interfaces J2, J3, J4 and J5 respectively. Take the reflective light rays R12 and R22 as an example, if a constructive interference occurs between the reflective light rays R12 and R22, the intensity of the reflective light rays R12 and R22 are added. On the contrary, if a destructive interference occurs between the reflective light rays R12 and R22, the intensity of the reflective light rays R12 and R22 are cancelled each other. Similarly, the destructive interference or the constructive interference occurs between the reflective light rays R12, R22, R32, R42 and R52. Theoretically, when a light ray travels across two different material, the light ray undergoes a phase shift of r or no phase shift at the interface. Specifically, in the case of a light ray traveling from a material with a higher refractive index to a material with a lower refractive index, the light undergoes one π phase shift when the light ray travel through an interface between the two materials; on the contrary, in the case of a light ray traveling from a material with a lower refractive index to a material with a higher refractive index, the light ray undergoes no phase shift when the light ray travels through an interface between the two materials. Thus, as the reflective light rays R12, R22, R32, R42 and R52 leave the lower semiconductor stack 23, in order to decrease the destructive interference between the reflective light rays R12, R22, R32, R42 and R52, the thickness di and the refractive index ni of one or each of the confining layer 231, the cladding layer 232, the buffer layer 233 and the contact layer 234 satisfy at least one of the following conditions:

(i) if the two phase shifts are the same, then $0.8*((2m-1)/2)*(\lambda/ni) \leq di \leq 1.2*((2m-1)*(\lambda/ni);$ (ii) if the two phase shifts are different, then $0.8*((2m-1)/4)*(\lambda/ni) \leq di \leq 1.2*((2m-1)*(\lambda/ni),$ where m is a natural number, and λ is the peak wavelength of the light emitted from the active layer 22 in the air.
The thickness di is preferred larger than 80 nm.

In the present embodiment, the peak wavelength of the light emitted from the light-emitting diode 100 is between 600 nm and 660 nm, and the active layer 22 is formed of multiple pairs of $(Al_xGa_{1-x})_{0.5}In_{0.5}P/(Al_yGa_{1-y})_{0.5}In_{0.5}P$, x≠y. For the upper semiconductor stack 21, the confining layer 211 is formed of $(Al_cGa_{1-c})_{0.5}In_{0.5}P$ wherein 0.55<c<0.65 and c>x or y. The cladding layer 212 is formed of $Al_{0.5}In_{0.5}P$. The window layer 213 is formed of $(Al_dGa_{1-d})_{0.5}In_{0.5}P$ wherein 0.65<b<0.75. For the lower semiconductor stack 23, the confining layer 231 is formed of $(Al_aGa_{1-a})_{0.5}In_{0.4}P$ wherein 0.55<a<0.65 and a>x or y. The cladding layer 232 is formed of $Al_{0.5}In_{0.5}P$. The buffer layer 233 is formed of $(Al_bGa_{1-b})_{0.5}In_{0.5}P$ wherein 0.65<b<0.75. The contact layer 234 is formed of GaP.

In the present embodiment, the peak wavelength λ is between 600 nm and 660 nm, the refractive index of the active layer 22 is larger than 3.35, the refractive index of the confining layer 231 is between 3.15 and 3.25, the refractive index of the cladding layer 232 is between 2.9 and 3.0, the refractive index of the buffer layer 233 is between 3.15 and 3.25, the refractive index of the contact layer 234 is between 3.3 and 3.4, and both of the refractive indices of the patterned transparent insulating layer 41 and the transparent conductive oxide layer 42 are between 1.2 and 2.2.

The refractive index of the confining layer 231 is between the refractive indices of the active layer 22 and that of the cladding layer 232, the refractive index of the cladding layer 232 is smaller than the refractive indices of the confining layer 231 and that of the buffer layer 233, and the refractive index of the contact layer 234 is larger than the refractive index of the buffer layer 233, the patterned transparent insulating layer 41 and the transparent conductive oxide layer 42. Following the travelling direction of the reflective light rays R12, R22, R32, R42 and R52, the two phase shifts of the two interfaces J1, J2 of the confining layer 231 are the same, the two phase shifts of the two interfaces J2, J3 of the cladding layer 232 are different and the two phase shifts of the two interfaces J4, J5 of the contact layer 234 are different. According to the abovementioned conditions, the thickness of the confining layer 231 is between 80 nm and 300 nm or preferred between 80 nm and 119 nm, the thickness of the cladding layer 232 is between 80 nm and 500 m or preferred between 85 nm and 129 nm and the thickness of the contact layer 234 is between 100 nm and 1000 nm or preferred between 189 nm and 285 nm. In one embodiment, if the thickness of the buffer layer 233 is much lower than the peak wavelength, e.g. lower than one seventh of the peak wavelength, the influence of the buffer layer 233 can be ignored. The total thickness of the lower semiconductor stack 23 is between 200 nm and 1 μm, or preferred between 370 nm and 560 nm. The distance between the reflector structure 4 and the active layer 22 is between 200 nm and 1 μm or preferred between 370 nm and 560 nm. According to the present embodiment, the influence of the destructive interference is reduced and the distance between the reflector structure 4 and the active layer 22 is lower than 1 μm, the light extraction efficiency is enhanced accordingly. Besides, it is evident that the far filed angle (FFA) of the light-emitting diode 100 is increased.

Second Embodiment

The differences between the second embodiment and the first embodiment are the compound of the epitaxial semiconductor stack 2 and the thicknesses of the sub-layers thereof. The peak wavelength of the light emitted from the light-emitting diode 100 is between 720 nm and 940 nm, and the active layer 22 is formed of multiple pairs of $(Al_sGa_{1-x})_{0.5}As_{0.5}/(In_tGa_{1-t})_{0.5}As_{0.5}$, s≠t. For the upper semiconductor stack 21, the confining layer 211 is formed of $(Al_eGa_{1-e})_{0.5}As_{0.5}$ wherein 0.25<e<0.35. The cladding layer 212 is formed of $(Al_fGa_{1-f})_{0.5}As_{0.5}$ wherein 0.4<f<0.5. The window layer 213 is formed of $(Al_gGa_{1-g})_{0.5}As_{0.5}$ wherein 0.25<g<0.35. For the lower semiconductor stack 23, the confining layer 231 is formed of $(Al_hGa_{1-h})_{0.5}As_{0.5}$ wherein 0.25<h<0.35. The cladding layer 232 is formed of $(Al_kGa_{1-k})_{0.5}As_{0.5}$ wherein 0.4<k<0.5. The buffer layer 233 is formed of InGaP. The contact layer 234 is formed of GaP.

In the present embodiment, the peak wavelength λ is between 720 nm and 940 nm, the refractive index of the active layer 22 is about 3.65, the refractive index of the confining layer 231 is between 3.3 and 3.5, the refractive index of the cladding layer 232 is between 3.18 and 3.3, the refractive index of the buffer layer 233 is between 3.18 and 3.3, the refractive index of the contact layer 234 is between 3.15 and 3.2, and the refractive indices of the patterned transparent insulating layer 41 and the transparent conductive oxide layer 42 are between 1.2 and 2.2. According to the abovementioned conditions, the thickness of the confining layer 231 is between 100 nm and 300 nm or preferred between 100 nm and 150 nm. Moreover, the refractive indices of the cladding layer 232 and the buffer layer 233 are almost the same. The cladding layer 232 and the buffer layer 233 can be regarded as a single layer, so the total thickness of the cladding layer 232 and the buffer layer 233 is between 100 nm and 350 nm or preferred between 106 nm and 160 nm. The thickness of the contact layer 234 is between 20 nm and 80 nm, which is smaller than one seventh of the peak wavelength, so the influence of the contact layer 234 can be ignored. The total thickness of the lower semiconductor stack 23 is between 250 nm and 1 μm or preferred between 250 nm and 375 nm. The distance between the reflector structure 4 and the active layer 22 is between 250 nm and 1 μm or preferred between 250 nm and 375 nm. According to the present embodiment, the influence of the destructive interference is reduced and the distance between the reflector structure 4 and the active layer 22 is lower than 1 μm, the light extraction efficiency is enhanced accordingly. Besides, it is evident that the far filed angle (FFA) of the light-emitting diode 100 is increased.

Although the present application has been explained above, it is not the limitation of the range, the sequence in practice, the material in practice, or the method in practice. Any modification or decoration for present application is not detached from the spirit and the range of such.

What is claimed is:

1. A light-emitting diode, comprising:
   an active layer;
   an upper semiconductor stack on the active layer and comprising a window layer; and
   a lower semiconductor stack below the active layer and comprising multiple semiconductor layers which combined have a thickness smaller than or equal to 1 μm, wherein the multiple semiconductor layers comprise a confining layer below the active layer, a cladding layer below the confining layer, a buffer layer below the cladding layer and a lower contact layer below the cladding layer.

2. The light-emitting diode according to claim 1, wherein the active layer emits a light ray having a peak wavelength and one of the multiple semiconductor layers has a thickness larger than one seventh of the peak wavelength λ in air.

3. The light-emitting diode according to claim 1, wherein the window layer is thicker than the lower semiconductor stack.

4. The light-emitting diode according to claim 1, wherein the lower contact layer comprises GaP.

5. The light-emitting diode according to claim 1, wherein the active layer emits a light ray having a peak wavelength and the lower contact layer has a thickness smaller than one seventh of the peak wavelength.

6. The light-emitting diode according to claim 1, wherein each of the multiple semiconductor layers has a refractive index between 2.9 and 3.5.

7. The light-emitting diode according to claim 1, wherein the window layer comprises $(Al_gGa_{1-g})_{0.5}As_{0.5}$, $0.25<g<0.35$ or $(Al_dGa_{1-d})_{0.5}In_{0.5}P$, $0.65<d<0.75$.

8. The light-emitting diode according to claim 1, further comprising a reflector below the lower semiconductor stack and comprising an insulating layer contacting the lower semiconductor stack, wherein the insulating layer has a refractive index lower than 1.5.

9. The light-emitting diode according to claim 8, wherein the insulating layer comprises $SiN_x$, $SiO_2$, $MgF_2$, or combination thereof.

10. The light-emitting diode according to claim 8, wherein the reflector further comprises a transparent conductive layer contacting the lower semiconductor.

11. The light-emitting diode according to claim 8, wherein a distance between the reflector and the active layer is between 200 nm and 1 μm.

12. The light-emitting diode according to claim 8, further comprising a substrate and bonding layer adhering the substrate and the reflector.

13. The light-emitting diode according to claim 1, wherein the active layer emits a light ray having a peak wavelength between 720 nm and 940 nm.

14. The light-emitting diode according to claim 1, wherein the widow layer has a thickness between 2 μm and 3 μm.

15. The light-emitting diode according to claim 1, wherein the window layer comprises a roughened surface.

16. The light-emitting diode according to claim 1, wherein the thickness of the lower semiconductor stack is between 200 nm and 1 μm.

17. The light-emitting diode according to claim 1, wherein the active layer comprises well layers and barrier layers laminated alternately, and a thickness of the well layer is between 20Å and 100Å.

18. The light-emitting diode according to claim 1, wherein the thickness of the confining layer is between 80 nm and 300 nm.

19. The light-emitting diode according to claim 1, wherein the thickness of the cladding layer is between 80 nm and 500 nm.

20. The light-emitting diode according to claim 1, wherein the thickness of the lower contact layer is between 20 nm and 80 nm.

* * * * *